(12) United States Patent
Avila et al.

(10) Patent No.: US 9,063,671 B2
(45) Date of Patent: Jun. 23, 2015

(54) WRITE OPERATIONS WITH FULL SEQUENCE PROGRAMMING FOR DEFECT MANAGEMENT IN NONVOLATILE MEMORY

(71) Applicant: SanDisk Technologies Inc., Plano, TX (US)

(72) Inventors: Chris Nga Yee Avila, Saratoga, CA (US); Gautam Ashok Dusija, Milpitas, CA (US); Jian Chen, Menlo Park, CA (US); Alexander Kwok-Tung Mak, Los Altos Hills, CA (US); Seungpil Lee, San Ramon, CA (US); Mrinal Kochar, San Jose, CA (US); Pao-Ling Koh, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 152 days.

(21) Appl. No.: 13/933,987

(22) Filed: Jul. 2, 2013

(65) Prior Publication Data

US 2015/0012684 A1   Jan. 8, 2015

(51) Int. Cl.
*G06F 12/00* (2006.01)
*G06F 3/06* (2006.01)
*G06F 12/02* (2006.01)

(52) U.S. Cl.
CPC ............ *G06F 3/0688* (2013.01); *G06F 3/0619* (2013.01); *G06F 3/065* (2013.01); *G06F 12/0246* (2013.01)

(58) Field of Classification Search
None
See application file for complete search history.

(56) References Cited

U.S. PATENT DOCUMENTS

| | | | |
|---|---|---|---|
| 4,763,305 A | 8/1988 | Kuo | |
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,661,053 A | 8/1997 | Yuan | |
| 5,687,121 A | 11/1997 | Lee et al. | |
| 5,768,192 A | 6/1998 | Eitan | |
| 5,774,397 A | 6/1998 | Endoh et al. | |
| 5,903,495 A | 5/1999 | Takeuchi et al. | |

(Continued)

FOREIGN PATENT DOCUMENTS

| WO | WO2012087411 | 6/2012 |
|---|---|---|
| WO | WO 2012/158521 | 11/2012 |
| WO | WO2012174216 | 12/2012 |

OTHER PUBLICATIONS

U.S. Appl. No. 13/934,013, entitled Write Operations for Defect Management in Nonvolatile Memory, filed Jul. 2, 2013, 47 pages.

(Continued)

*Primary Examiner* — Brian Peugh
(74) *Attorney, Agent, or Firm* — Davis Wright Tremaine LLP

(57) ABSTRACT

Data that is stored in a higher error rate format in a nonvolatile memory is backed up in a lower error rate format. Data to be stored may be transferred once to on-chip data latches where it is maintained while it is programmed in both the high error rate format and the low error rate format without being resent to the nonvolatile memory. High error rate format may be MLC format and programming in the high error rate format may program both lower page and upper page data together in a full sequence programming scheme that is suitable for handling high data volume.

18 Claims, 14 Drawing Sheets

(56) References Cited

U.S. PATENT DOCUMENTS

| | | | |
|---|---|---|---|
| 6,011,725 | A | 1/2000 | Eitan |
| 6,046,935 | A | 4/2000 | Takeuchi et al. |
| 6,222,762 | B1 | 4/2001 | Guterman et al. |
| 7,016,226 | B2 | 3/2006 | Shibata et al. |
| 7,057,939 | B2 | 6/2006 | Li et al. |
| 7,120,051 | B2 | 10/2006 | Gorobets et al. |
| 7,315,916 | B2 | 1/2008 | Bennett et al. |
| 7,505,320 | B2 | 3/2009 | Li |
| 7,508,721 | B2 | 3/2009 | Li et al. |
| 7,951,669 | B2 | 5/2011 | Harari et al. |
| 8,027,195 | B2 | 9/2011 | Li et al. |
| 8,094,400 | B1 | 1/2012 | Han |
| 8,144,512 | B2 | 3/2012 | Huang et al. |
| 8,214,700 | B2 | 7/2012 | Chen |
| 8,244,960 | B2 | 8/2012 | Paley et al. |
| 8,307,241 | B2 | 11/2012 | Avila et al. |
| 8,472,280 | B2 | 6/2013 | Li |
| 8,566,671 | B1 | 10/2013 | Ye et al. |
| 8,750,042 | B2 | 6/2014 | Sharon et al. |
| 2006/0239080 | A1 | 10/2006 | Li |
| 2007/0109858 | A1 | 5/2007 | Conley et al. |
| 2008/0013372 | A1 | 1/2008 | Lee et al. |
| 2009/0089482 | A1 | 4/2009 | Traister |
| 2009/0180318 | A1 | 7/2009 | Takada |
| 2010/0174847 | A1 | 7/2010 | Paley et al. |
| 2010/0318721 | A1 | 12/2010 | Avila et al. |
| 2010/0318839 | A1 | 12/2010 | Avila et al. |
| 2011/0072332 | A1 | 3/2011 | Tomlin |
| 2011/0096601 | A1 | 4/2011 | Gavens et al. |
| 2011/0099418 | A1 | 4/2011 | Chen |
| 2011/0099460 | A1 | 4/2011 | Dusija et al. |
| 2011/0149650 | A1 | 6/2011 | Huang et al. |
| 2011/0153912 | A1 | 6/2011 | Gorobets et al. |
| 2011/0267885 | A1 | 11/2011 | Kato |
| 2012/0001247 | A1 | 1/2012 | Alsmeier |
| 2012/0014186 | A1 | 1/2012 | Li |
| 2012/0167100 | A1 | 6/2012 | Li et al. |
| 2012/0182803 | A1 | 7/2012 | Shirakawa |
| 2012/0256247 | A1 | 10/2012 | Alsmeier |
| 2012/0272120 | A1 | 10/2012 | Chen |
| 2012/0287710 | A1 | 11/2012 | Shirakawa |
| 2012/0297122 | A1 | 11/2012 | Gorobets et al. |
| 2012/0311244 | A1 | 12/2012 | Huang et al. |
| 2013/0024605 | A1 | 1/2013 | Sharon et al. |
| 2013/0028021 | A1 | 1/2013 | Sharon et al. |
| 2013/0031429 | A1 | 1/2013 | Sharon et al. |
| 2013/0031430 | A1 | 1/2013 | Sharon et al. |
| 2013/0031431 | A1 | 1/2013 | Sharon et al. |
| 2013/0107628 | A1 | 5/2013 | Dong et al. |
| 2013/0155769 | A1 | 6/2013 | Li et al. |
| 2013/0173844 | A1* | 7/2013 | Chen et al. .................... 711/103 |
| 2013/0220088 | A1 | 8/2013 | Horn et al. |
| 2013/0254458 | A1* | 9/2013 | Pittelko ........................ 711/103 |
| 2013/0308392 | A1* | 11/2013 | Nishijima et al. ....... 365/189.02 |
| 2014/0043901 | A1 | 2/2014 | Kwak |

OTHER PUBLICATIONS

U.S. Appl. No. 14/097,523, entitled Systems and Methods for Partial Page Programming of Multi Level Cells, filed Dec. 5, 2013, 41 pages.
U.S. Appl. No. 14/086,162, entitled Update Block Programming Order, filed Nov. 21, 2013, 45 pages.
U.S. Appl. No. 14/094,550 entitled "Multi-Die Write Management," filed Dec. 2, 2013, 32 pages.
U.S. Appl. No. 14/099,027 entitled "Lower Page Only Host Burst Writes," filed Dec. 6, 2013, 46 pages.
Office Action for U.S. Appl. No. 14/281,432 mailed Jul. 16, 2014, 26 pages.
Notice of Allowance for U.S. Appl. No. 14/281,432 mailed Nov. 21, 2014, 11 pages.
Notificiation of Transmittal of the International Search Report and the Written Opinion of the International Searching Authority, or the Declaration for Int'l Application No. PCT/US2014/044937 mailed Oct. 30, 2014.
Orlando, "EEPROM Standards and Reliability: An Interim Report," EDN Electrical Design News (Texas Instrument), Reed Business Information, Highlands Ranch, CO, US, vol. 30, No. 1, Jan. 10, 1985, pp. 159-174.
Eitan et al., "NROM: A Novel Localized Trapping, 2-Bit Nonvolatile Memory Cell," IEEE Electron Device Letters, vol. 21, No. 11, Nov. 2000, pp. 543-545.
U.S. Appl. No. 13/929,368 entitled "Efficient Post Write Read in Three Dimensional Nonvolatile Memory," filed Jun. 27, 2013, 49 pages.
U.S. Appl. No. 13/788,415 entitled Write Sequence Providing Write Abort Protection, filed Mar. 7, 2013, 36 pages.
Technical Search Report, Patent Examination: Frederik Wahlin, Jun. 4, 2013, 7 pages.
Non-Final Office Action issued for U.S. Appl. No. 13/934,013 mailed Apr. 17, 2015, 21 pages.

* cited by examiner

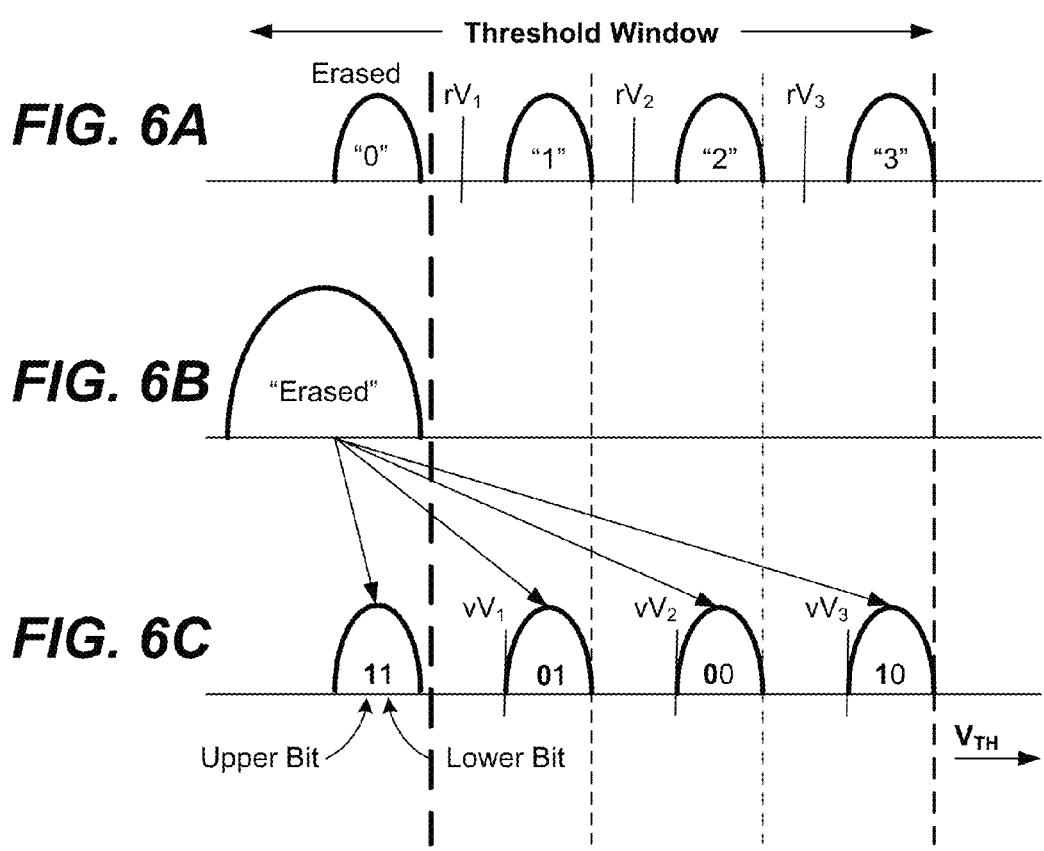
Programming into four states represented by a 2-bit code

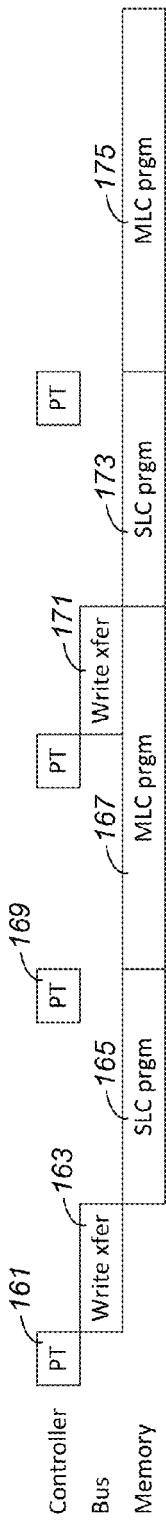
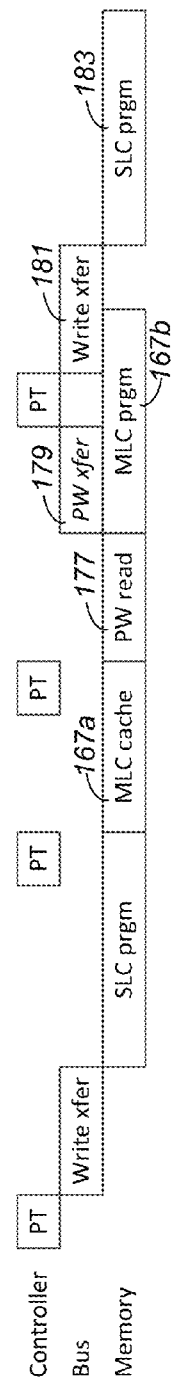
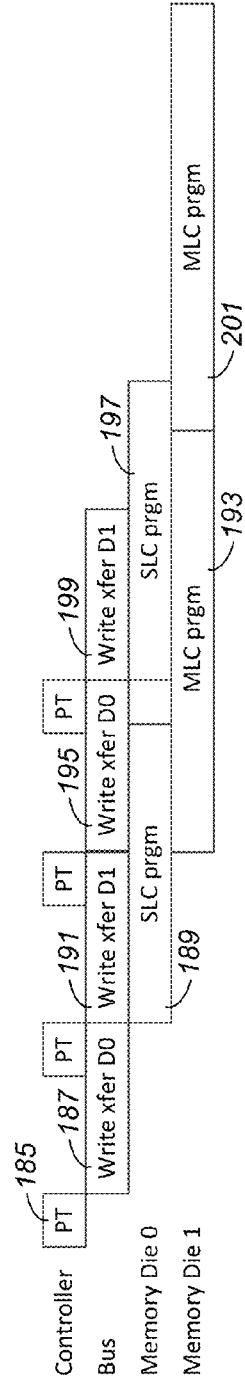

WRITE OPERATIONS WITH FULL SEQUENCE PROGRAMMING FOR DEFECT MANAGEMENT IN NONVOLATILE MEMORY

CROSS-REFERENCE TO RELATED APPLICATIONS

This application is related to U.S. patent application entitled, "Write operations for defect management in nonvolatile memory," by Avila et al., filed on the same date as the present application, which is hereby incorporated by reference in its entirety.

BACKGROUND

This application relates to the operation of three dimensional re-programmable non-volatile memory systems and to systems and methods for ensuring that data is efficiently and accurately stored in such nonvolatile memory systems.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into its memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row, or word line typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

A three dimensional nonvolatile memory array stores copies of incoming data in two different formats, one having a higher density and higher error rate (e.g. MLC) and one having a lower density and lower error rate (e.g. SLC). Both copies may serve as backup to each other in case a memory defect develops in either of the copies rendering that copy unusable. Later, the higher density copy is compared with the lower density copy to determine if the higher density copy is acceptable before the lower density copy is erased. Both copies of a page are written from data stored in on-chip data latches so that a single data transfer to a memory die allows the two copies to be written without further data transfer. Full page sequence programming allows lower and upper pages to be written together saving time. Both lower and upper pages may be sent and written in SLC. Then, the lower and upper pages may be written together from the on-chip latches without any further transfer. Programming may be suspended to allow a post write read to be performed on previously stored data. Then, the post write read data may be transferred to the memory controller in parallel with resumed programming.

An example of a method of operating a nonvolatile memory array includes: receiving a first portion of data to be stored in the nonvolatile memory array; buffering the first portion of data in on-chip data latches; writing the first portion of data from the on-chip data latches to the nonvolatile memory array in Single Level Cell (SLC) format; subsequently receiving a second portion of data to be stored in the nonvolatile memory array; buffering the second portion of data in the on-chip data latches with the first portion of data; subsequently, writing the first and second portions of data together in Multi Level Cell (MLC) format in a word line of an MLC block as lower page and upper page data respectively; subsequently, receiving the second portion of data at least partially in parallel with the storing the first and second portions together in MLC format; subsequently storing the second portion of data in SLC format; subsequently comparing the second portion in MLC format with the second portion in SLC format to determine if the second portion in MLC format meets a standard; and discarding the first and second portions in SLC format only if the second portion in MLC format meets the standard.

The method may further include: suspending the storing of the first and second portions of data together in MLC format in the word line of the MLC block; subsequently, performing a post write read of a third portion of data from another MLC block that was previously filled; subsequently, resuming the storing of the first and second portions together in MLC format in the word line of the MLC block; and in parallel with the resumed storing of the first and second portions together in MLC format in the word line of the MLC block, transferring the third portion of data from the post write read. The method may still further include: comparing the first portion in MLC format with the first portion in SLC format to determine if the first portion in MLC format meets a standard; and discarding the first and second portions in SLC format only if the first portion in MLC format meets the standard. Comparing may occur only after the MLC block is full. The comparing may include determining a number of bits that are different between the second portion of data in MLC format and the second portion of data in SLC format. The standard may be a limit for the number of bits that are different. If the second portion in MLC format does not meet the standard, then the first and second portions in MLC format may be discarded and the first and second portions in SLC format may be used.

An example of a method of operating a three dimensional nonvolatile memory array includes: receiving first and second portions of data to be stored in the three dimensional non-volatile memory array; buffering the first and second portions of data in on-chip data latches; writing the first and second portions of data in a Single Level Cell (SLC) portion of the three dimensional nonvolatile memory array; subsequently writing the first portion of data as lower page data and writing the second portion of data as upper page data together in a row of a Multi Level Cell (MLC) portion of the memory array; maintaining the first portion of data in on-chip data latches throughout a time that extends from the buffering of the first portion of data to the writing the first portion of data as lower page data in the MLC portion of the memory array; and subsequently erasing the first and second portions of data in the SLC portion only after a post write read confirms that the MLC portion of the memory array contains an accurate copy of the first and second portions of data.

The second portion of data may be maintained in on-chip data latches throughout a time that extends from the buffering of the second portion of data to the writing of the second portion of data as upper page data in the MLC portion of the memory array. A die busy signal may be maintained until the first portion of data is written as lower page data in the row of the MLC portion of the memory array. A die ready signal may be initiated when the first portion of data is written as lower page data in the row of the MLC portion of the memory array prior to writing the second portion of data as upper page data in the row of the MLC portion. The method may further include: suspending the storing of the first and second portions together in the row of the MLC portion; subsequently, performing a post write read of a third portion of data from another MLC block that was previously filled; subsequently, resuming the storing of the first and second portions together in MLC format in the row of the MLC portion; and in parallel with the resumed storing of the first and second portions together in MLC format in the row of the MLC portion, transferring the third portion of data from the post write read. The post write read may include: comparing at least the second portion in MLC format with the second portion in SLC format to determine if the second portion in MLC format meets a standard; and discarding the first and second portions in SLC format only if the second portion in MLC format meets the standard. The post write read may sample a block of the MLC portion by reading at least one word line from each group of connected word lines and reading at least one word line of each set of strings of the block. A latch transfer operation may be performed to move the first portion of data and/or the second portion of data between rows of the on-chip data latches.

An example of a three dimensional nonvolatile memory system includes: a Single Level Cell (SLC) portion of the three dimensional nonvolatile memory array; a Multi Level Cell (MLC) portion of the three dimensional nonvolatile memory array; on-chip data latches that are configured to hold data to be stored in the SLC and MLC portions throughout a time from receiving the data until the data is stored in both SLC and MLC portions; a write circuit that is configured to write lower page data and upper page data from the on-chip data latches to the SLC portion, and then write the lower page data and the upper page data together from the on-chip data latches to the MLC portion; a determination circuit configured to determine whether programmed data in a fully programmed block of the MLC portion meets a standard; and a reclaim circuit that is configured to erase blocks of the SLC portion in response to the determination circuit determining that a corresponding fully programmed block of the MLC portion meets the standard.

The write circuit may be configured to write the lower page data and the upper page data together along a word line of the MLC portion. Sampling circuits may be configured to sample data of a fully written block of the MLC portion and provide sampled data to the determination circuit for comparison with corresponding data from the SLC portion.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6C illustrate an example of programming a population of 4-state memory cells.

FIG. 12 is a timing diagram illustrating writing data in SLC and MLC formats from on-chip data latches.

FIG. 13 is a timing diagram illustrating suspension of MLC writing to perform a post write read of a previously programmed block, and subsequent resumption of MLC writing.

FIG. 14 is a timing diagram illustrating an example of storage of SLC data in one memory die and MLC data in a different memory die in an efficient manner.

DETAILED DESCRIPTION

Memory System

Figure 1:
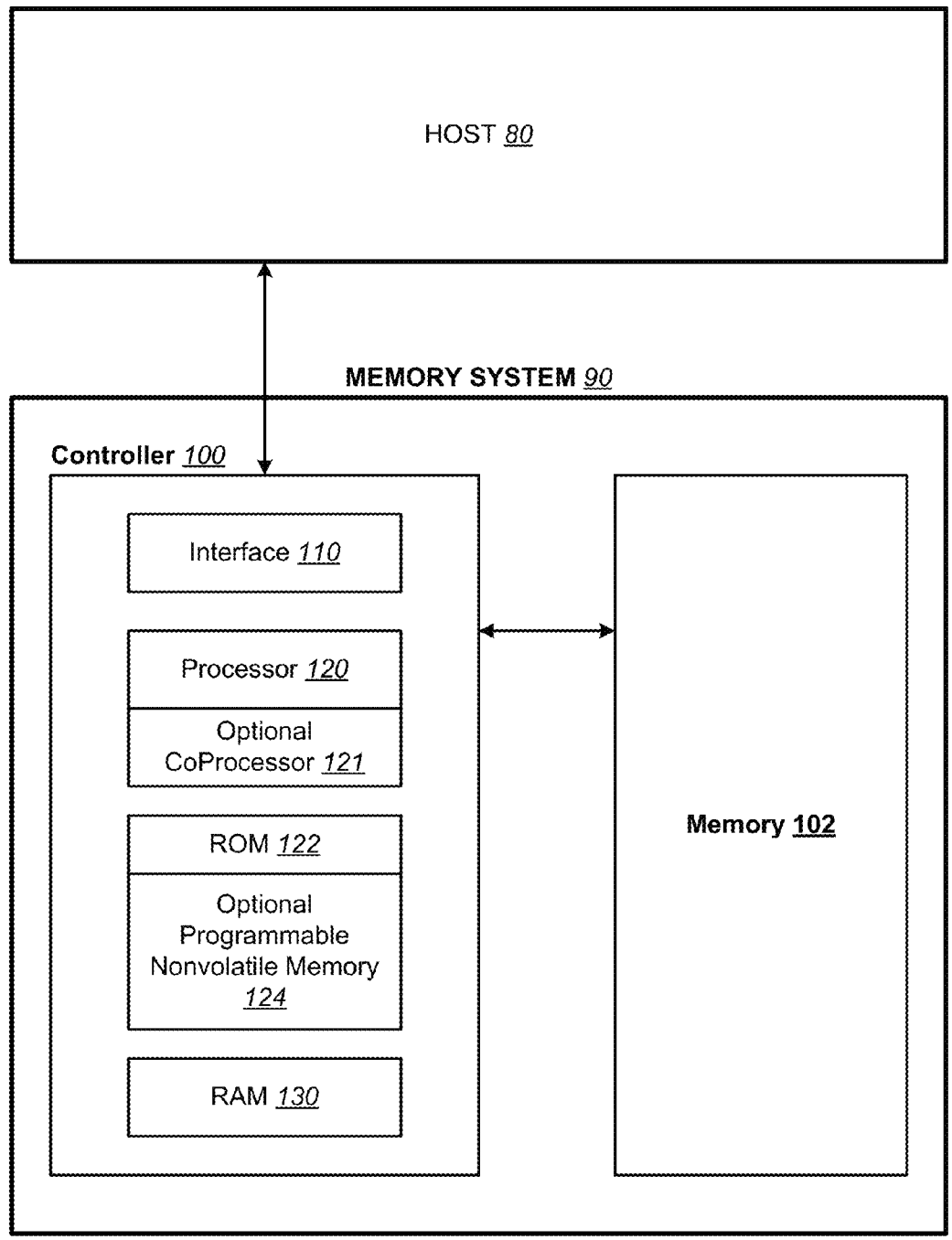
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the faun of a memory card or an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. A controller is typically formed as an ASIC (application specific integrated circuit) and the components included in such an ASIC generally depend on the particular application.

Physical Memory Structure

Figure 2:
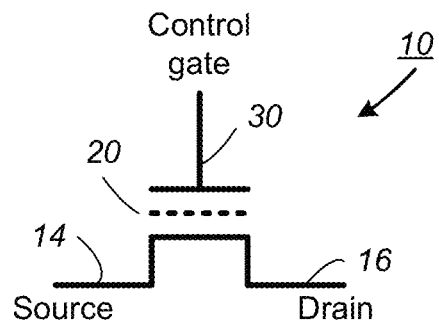
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
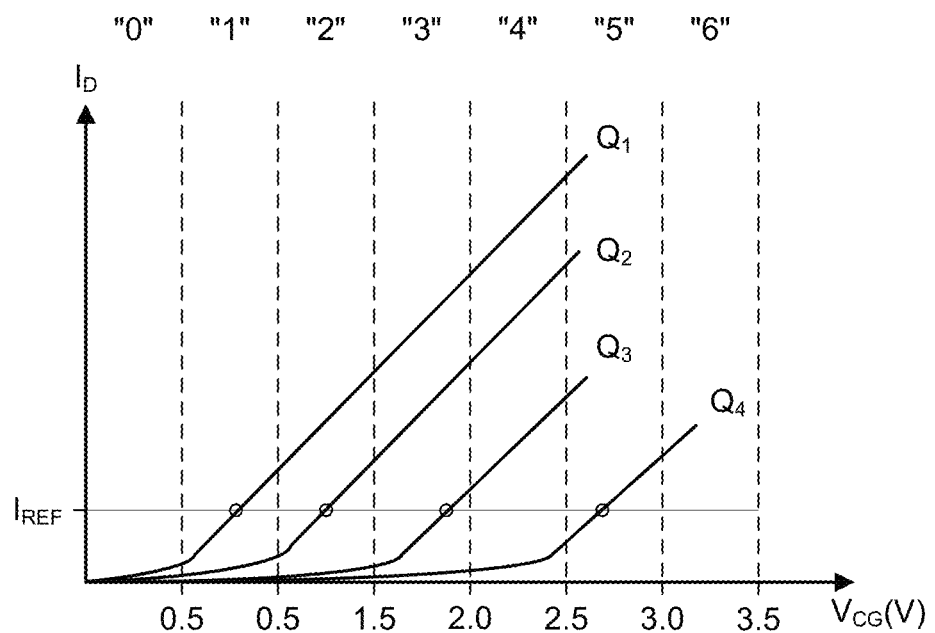
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four charge levels that can be programmed on a floating gate of a memory cell, respectively corresponding to four of eight possible memory states. As an example, the threshold voltage window of a population of cells may range from 0.5V to 3.5V. Seven programmed memory states "0", "1", "2", "3", "4", "5", "6", respectively, and one erased state (not shown), may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
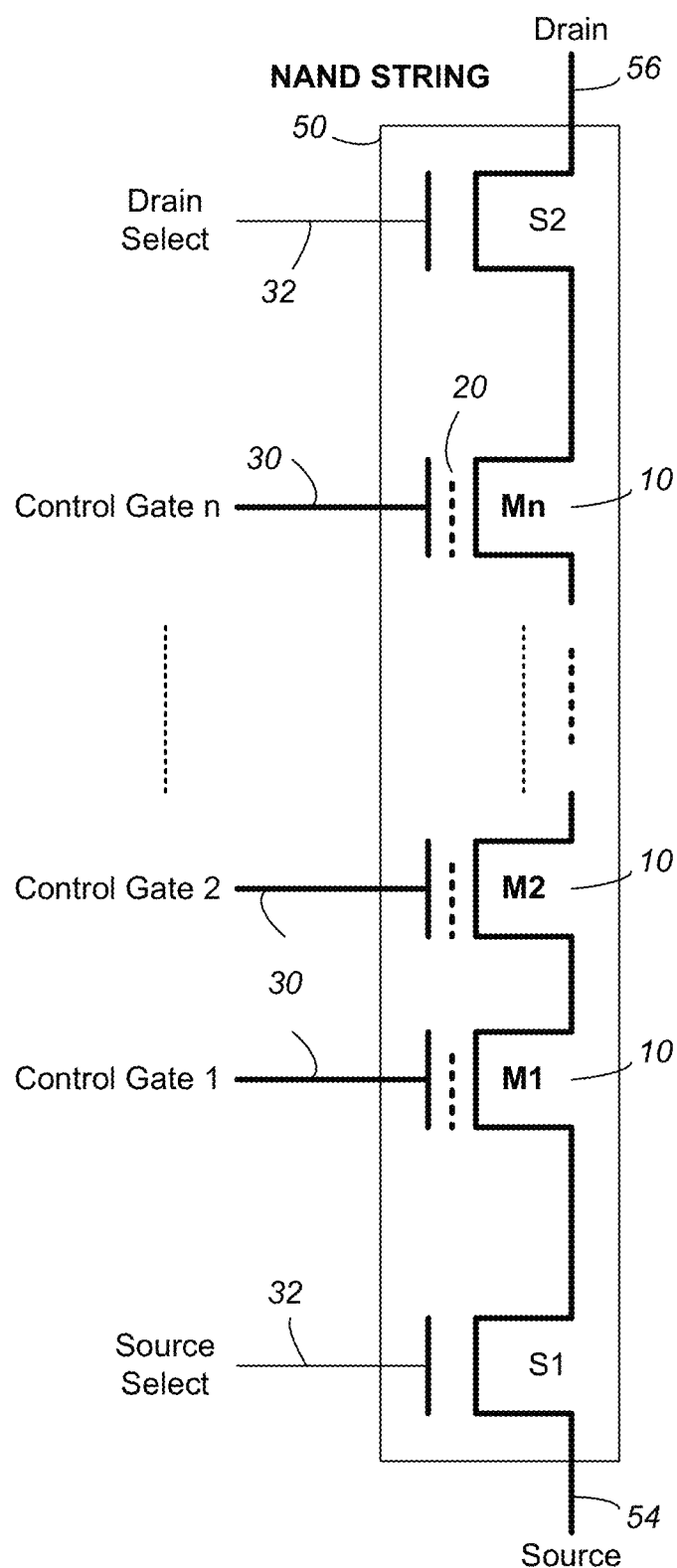
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
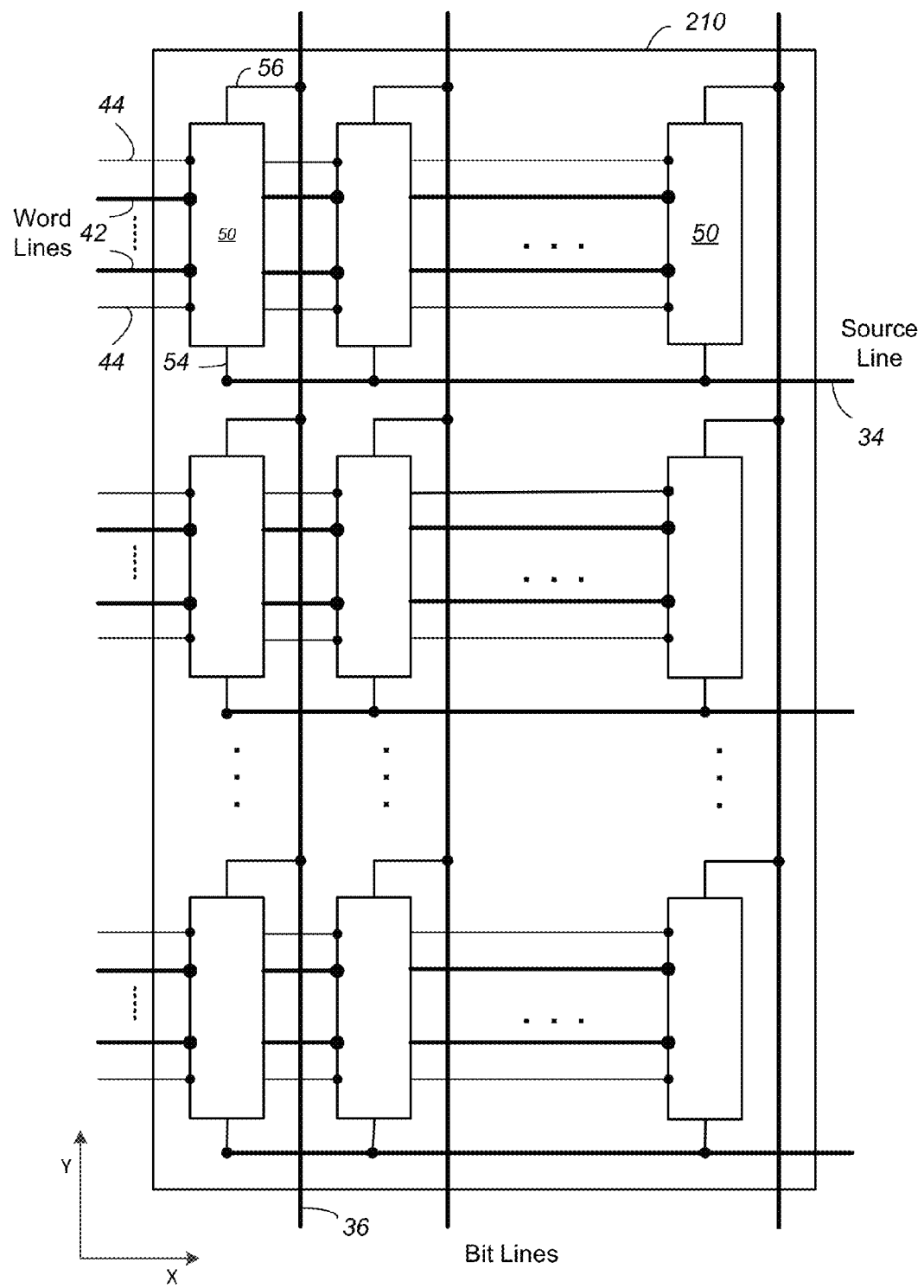
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
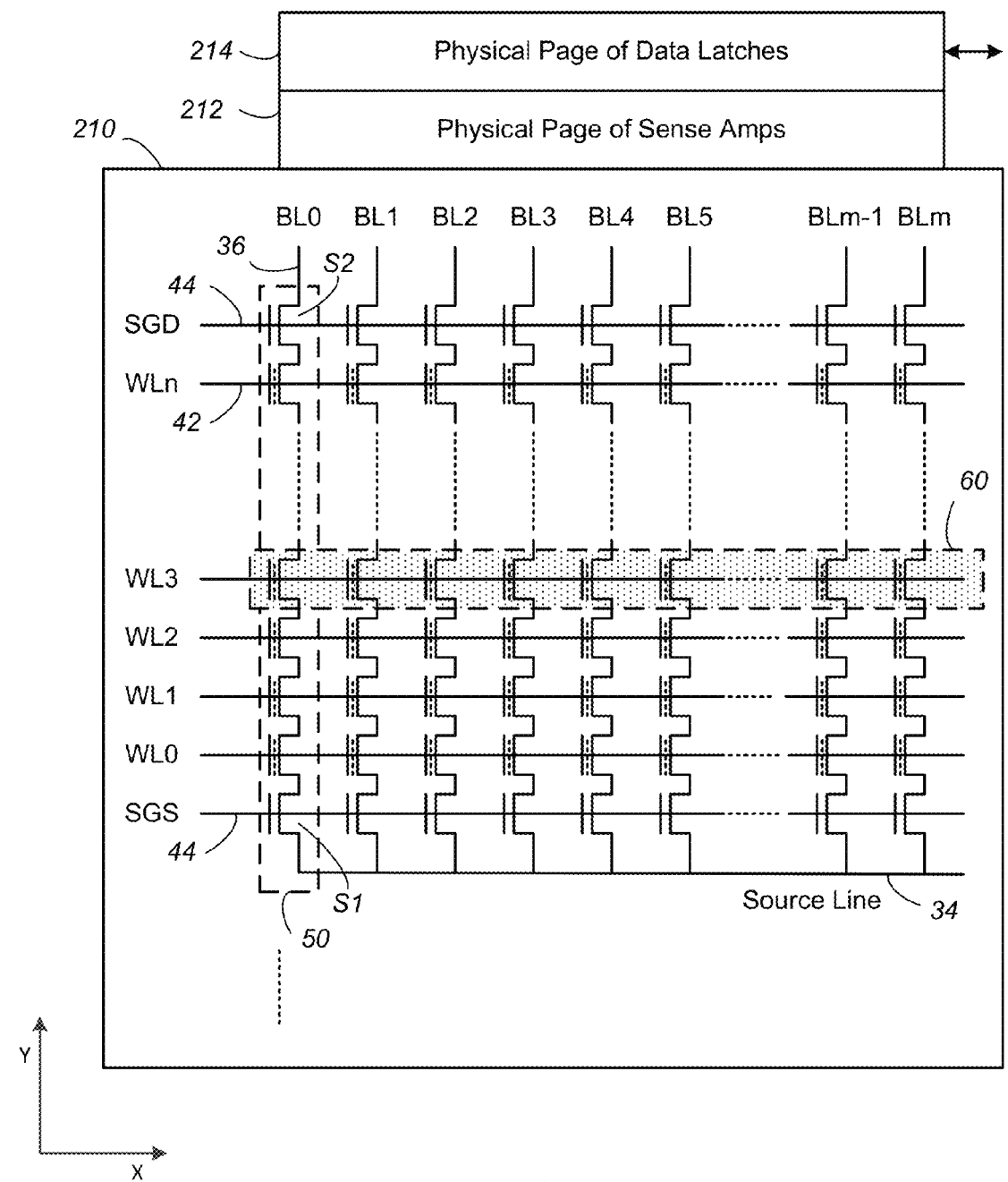
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing one and must be written to a previous unwritten location.

Erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-bit, Full-Sequence MLC Programming

FIG. 6A-6C illustrate an example of programming a population of 4-state memory cells. FIG. 6A illustrates the population of memory cells programmable into four distinct distributions of threshold voltages respectively representing memory states "0", "1", "2" and "3". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10", The 2-bit data may be read from the memory by sensing in "full-sequence" mode where the two bits are sensed together by sensing relative to the read demarcation threshold values $rV_1$, $rV_2$ and $rV_3$ in three subpasses respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 7:
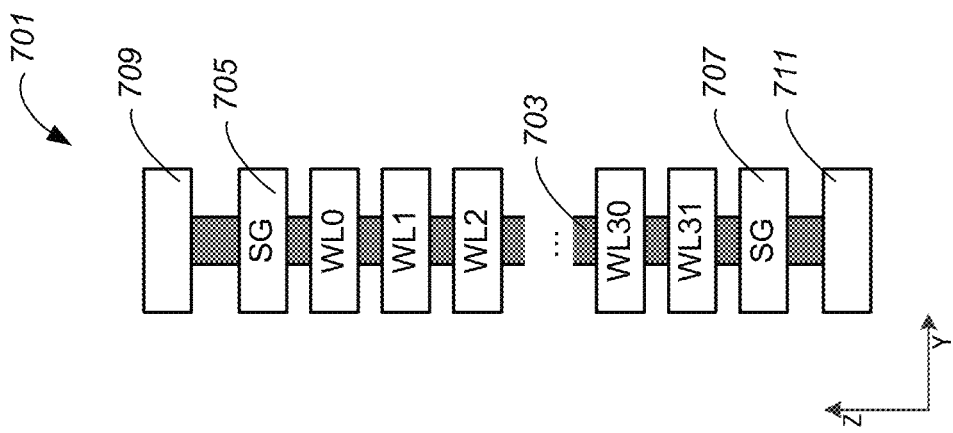
FIG. 7 illustrates an example of a NAND string that extends vertically from a substrate in the z-direction.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

Figure 8:
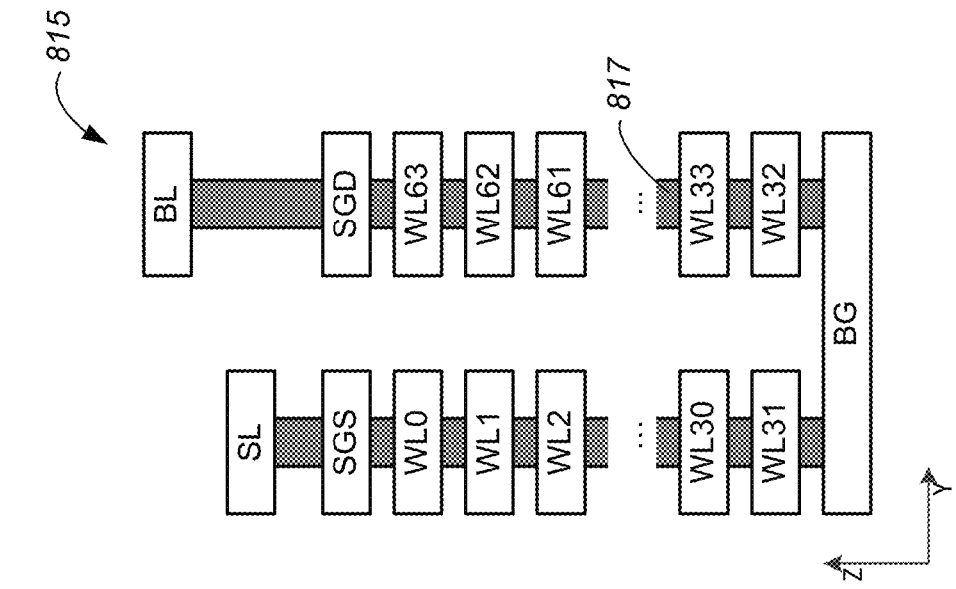
FIG. 8 illustrates another example of a NAND string that extends vertically from a substrate in the z-direction.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two sides of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9A:
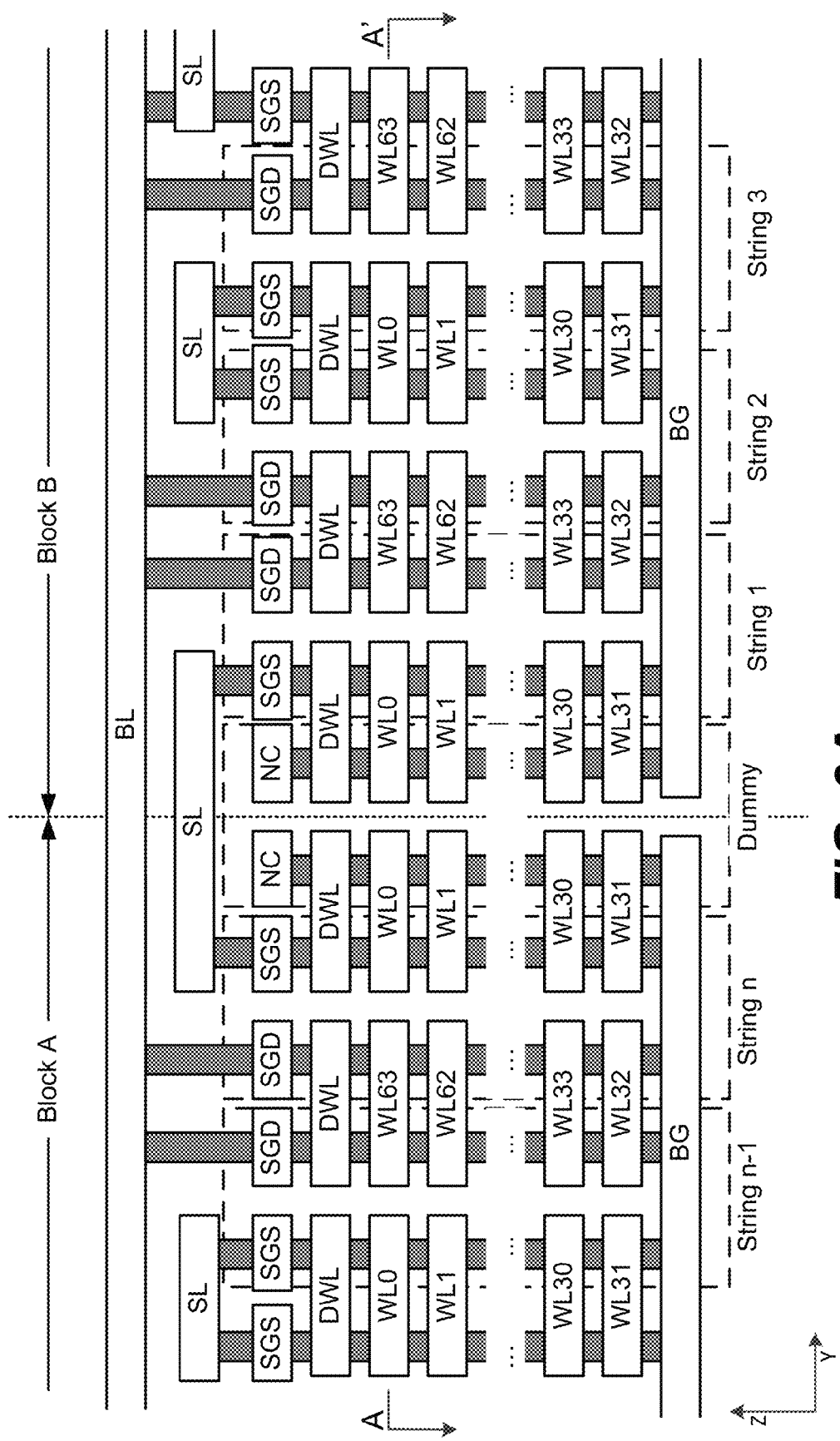
FIG. 9A shows an example of a 3-D NAND memory array in cross section along the y-z plane.

Vertical NAND strings may be arranged to form a 3-D NAND array in various ways. FIG. 9A shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

FIG. 9A shows some details of the structure of a block that is made up of U-shaped vertical NAND strings. Block A contains n strings connected to the bit line BL. While only strings n, and n−1 of Block A are shown, it will be understood that the repetitive structure continues to the left where strings 1 to n−2 are located. Block B contains n strings connected to bit line BL. While only strings 1-3 of Block B are shown, it will be understood that the repetitive structure continues to the right where strings 4 to n are located. It will also be understood that the cross section shown is along one of many bit lines that serve the block and that there are many similar bit lines that extend along the y-direction, and are separated from each other along the x-direction (e.g. are behind the bit line shown in FIG. 9A). Word lines extend along the x-direction, perpendicular to the plane of FIG. 9A, to connect sets of strings of different bit lines. Similarly, select lines extend in the x-direction so that a set of strings may be selectively connected, or isolated, as a unit. In the example shown, word lines are formed so that a single conductive strip forms a word line of two adjacent strings. Thus, for example, in Block B, string 1 and string 2 have word lines WL32-WL63 that are formed by common conductive strips. In contrast, select lines are not shared between neighboring strings. This allows separate selection of an individual set of strings within a block, even though the selected set of strings may include word lines that are not separately controllable from word lines of unselected strings.

FIG. 9A shows dummy word lines "DWL" separating select lines SGD, SGS, from host data word lines WL0-WL63. While host data word lines are used to store host data (i.e. data that may be sent to the memory from an external source with the expectation that the data will be returned in response to a read command), dummy word lines do not store host data. They may store nothing, or may store some dummy data that puts the dummy cells in a desirable condition (e.g. puts their threshold voltages at levels that make accessing other cells easier, or reduces risk of disturbance). The dummy word lines shown provide some protection for stored data. In particular, the word line closest to the select gate may be vulnerable to data disturbance because of its proximity to the select gate. By making this word line a dummy word line, the danger of disturbing host data is reduced. In some cases, two or more dummy word lines may be provided between a select line and host data word lines because the risk of disturbance extends more than one word line from the select line. Dummy word lines may be located at other locations besides the single location shown. One or more dummy word lines may be located between host data word lines and the back gate ("BG") for example. Dummy word lines generally have the same physical structure as host data word lines so that the number and location of dummy word lines may be configurable for any given array structure.

Where Block A and Block B meet, there are dummy memory cells in both blocks (i.e. between String n of Block A and String 1 of Block B). Half a NAND string of dummy cells is provided in each block in this example so that host data word lines of the two blocks are separated by two dummy word lines. This is to reduce disturbance that might occur if host data word lines of different blocks were immediately adjacent to each other. Dummy select lines, which are not connected to control circuits (marked "NC" for "not connected") are also provided where neighboring blocks meet in this example. Different arrangements of dummy word lines, and other dummy structures between blocks are possible according to memory design and operating requirements. For example, select lines may be connected, back gates of neighboring blocks may be in closer proximity than shown, dummy word lines may be connected in different ways, etc.

Figure 9B:
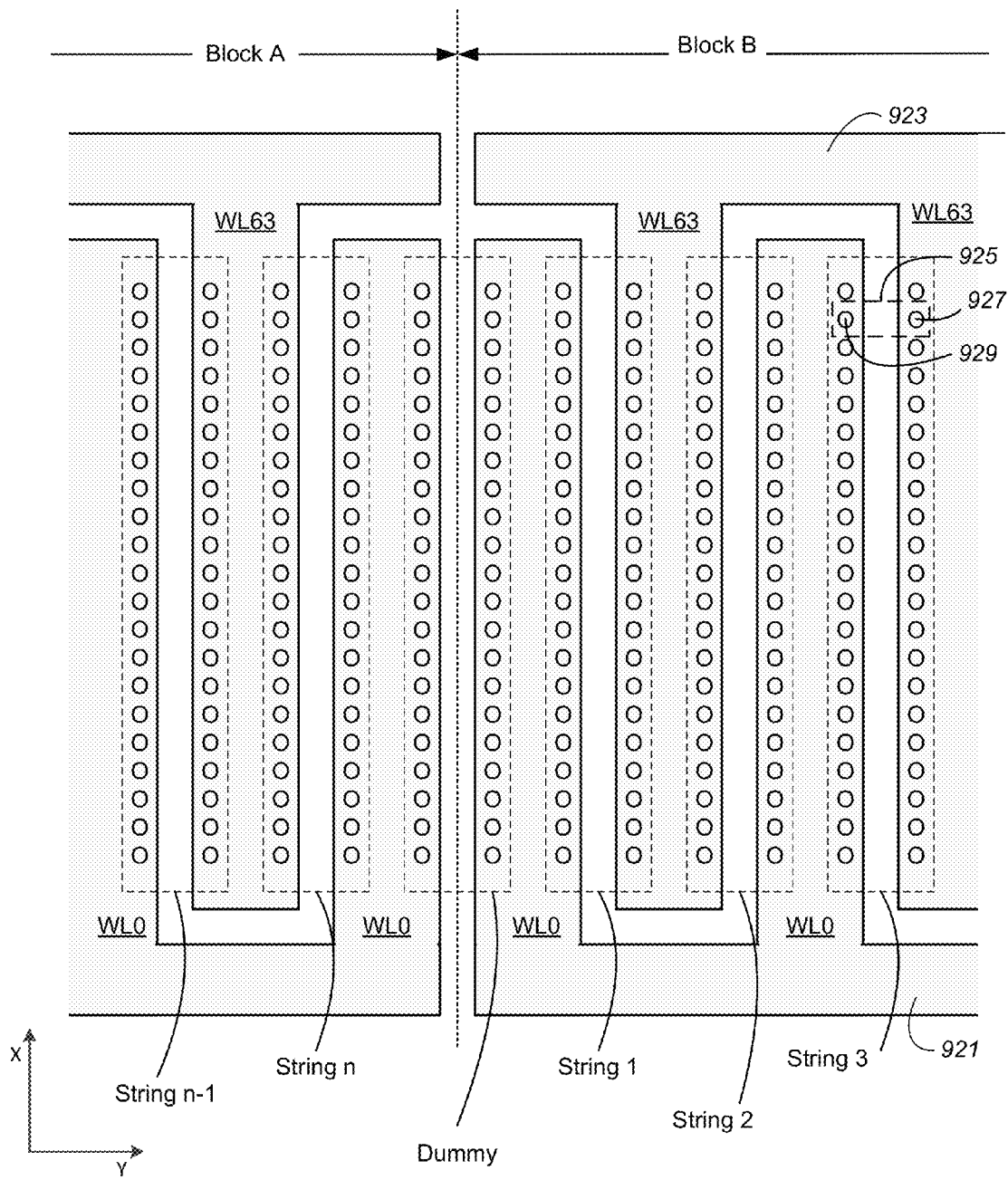
FIG. 9B shows the 3-D NAND memory array of FIG. 9A in cross section along the x-y plane.

The 3-D NAND memory array of FIG. 9A is further illustrated in FIG. 9B, which shows a cross section along A-A' of FIG. 9A (i.e. along the x-y plane that intersects WL0 and WL63). It can be seen that word lines of a block are formed of strips of conductive material that are connected together. Thus, all word lines marked WL0 in different strings of a block are electrically connected together and are formed from a single electrically conductive body 921. Similarly, all word lines marked WL63 in different strings of a block are electrically connected together and are formed from a single electrically conductive body 923. The two bodies that form word lines of a block on a given level appear as interdigitated fingers extending from opposite sides of the block. These two bodies may be separated by Shallow Trench Isolation (STI) dielectric, or by any suitable insulator. A similar pattern may be found at each level of word lines (e.g. WL1 and WL62 are similarly interdigitated, as are WL2 and WL61, and so on).

Word lines of different blocks are isolated from each other. Thus, WL0 of Block A is separate, and electrically isolated from WL0 of Block B. Similarly, WL63 of Block A is separate, and electrically isolated from WL63 of Block B.

Memory holes are shown as circles (memory holes are cylindrical in shape and extend in the z-direction, perpendicular to the cross section shown). A U-shaped NAND string 925 extends along two memory holes 927, 929, with one memory hole 927 passing through body 923 and the other memory hole 929 passing through body 921. A set of strings consists of all such strings that are aligned along the x-direction and that share select lines (which also extend along the x-direction). For example, one such set is made up of all strings indicated by "String 3" in Block B, including string 925. When a given set of strings within a block is selected, a selected word line (or portion of a word line, i.e. a subset of the bit lines that intersect the word line) may be read by applying appropriate word line voltages to the selected word line and to unselected word lines.

Word line drivers are connected to supply appropriate voltages to connected word lines of a block (e.g. to bodies 923 and 921) so that a word line of the block can be accessed (e.g. programmed or read). Select line drivers are connected to supply appropriate voltages to select lines so that a particular set of strings in a block is selected.

In general, 3-D memories have more failure modes than 2-D memories because of the proximity of components near memory cells in the vertical direction as well as the horizontal direction. This combined with smaller feature sizes and complex processing needed to produce such small 3-D structures tends to increase the chances that a cell or a group of cells will fail. In many cases these failures are not apparent when data is initially written (i.e. the data is initially written and verified as being within permitted limits). However, when data is later read it may be found to be damaged. For example, the data may be uncorrectable by Error Correction Code (ECC). Such data is sometimes referred to as "UECC" data.

Post Write Read

In some cases, a post write read may be performed at some time after data is programmed, while another safer copy of the data is still available, to confirm that the data is correctly written. This is different from a read-verify step performed during programming and takes place only after some intermediate operations such as programming of other portions of the memory array. In some cases, a word line that is programmed may be affected by subsequent programming of neighboring word lines so that a post write read may be performed after programming of neighboring word lines to ensure that the data has not become UECC or otherwise damaged by the programming of neighboring word lines. Examples of post write read systems and methods are described in U.S. Patent Publications Numbers 20110096601; 20110099460; 20130028021; 20130031429; 20130031430; 20130031431; and in U.S. Pat. No. 8,214,700 which are hereby incorporated by reference in their entirety.

In general, using a post write read operation requires maintaining a safe backup copy of data in a short-term location until it is confirmed that the data is successfully programmed in a long-term location. For example, the short-term location may be in an SLC block where the copy is less likely to be damaged (lower error rate). It is generally desirable to avoid keeping such backup copies for longer than necessary because of the additional space required.

Figure 10:
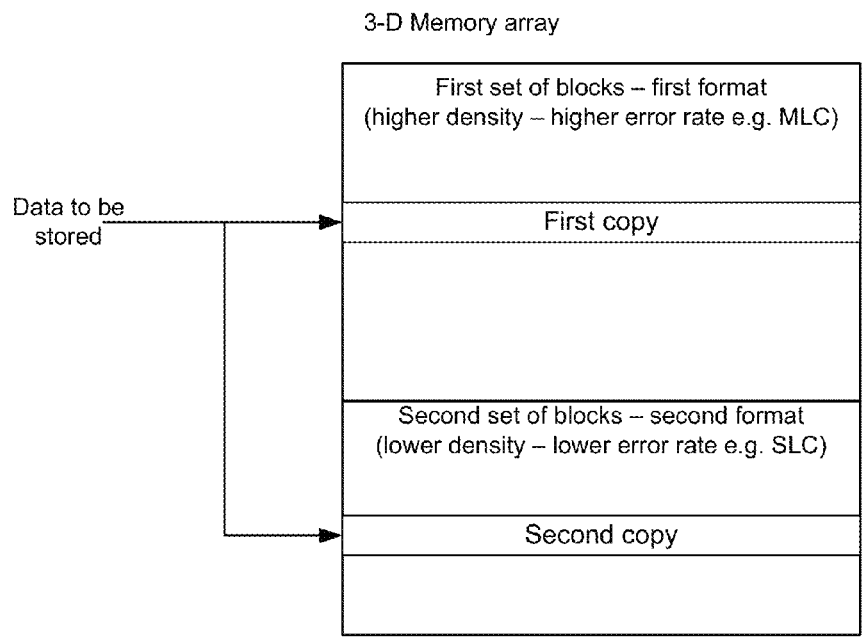
FIG. 10 shows a 3-D memory array having a first set of blocks of a first format and a second set of blocks of a second format.

FIG. 10 illustrates a 3-D memory array that has two sets of blocks, a first set of blocks that store data in a first format, and a second set of blocks that maintain data in a second format. In this example, the first format is a higher density, higher error rate format that is suitable for long term storage and the second format is a lower density, lower error rate format that is suitable for short-term storage. For example, the first format may be MLC and the second format may be SLC. Alternatively, the first format may be MLC with a higher number of bits per cell and the second format may be MLC with a smaller number of bits per cell (e.g. the first format may store three bits per cell "TLC" and the second format may store two, or the first format may store four bits per cell and the second format may store two or three bits per cell). In some cases, a block may be configured for MLC operation with more than two memory states but may then be operated using a subset of the configured states. For example, a block may be configured to store two bits per cell using four memory states and then only store one bit per cell by using just two of the available memory states. In some cases, individual blocks may be configured to store data in either format so that a block may be in the first set of blocks at one time and may be in the second set of blocks at another time. Such dynamic assignment may assign blocks to the first set or second set as needed from a common pool of blocks (e.g. an erased block pool). In other cases, the assignment of blocks to the first set and the second set is static so that an individual block remains in one set throughout the product lifetime. In other examples, the blocks of different sets may be physically different so that a block is permanently assigned based on its physical structure.

When the data is received (e.g. from a host or memory controller) a copy of the data is stored in both formats. A first copy of the data is stored in the first set of blocks in the first format and a second copy of the data is stored in the second set of blocks in the second format. These copies may be stored in any order (e.g. first copy first, or second copy first, or in parallel). The labels "first" and "second" do not necessarily indicate order of storing or other order.

The second copy acts as a backup copy in case the first copy is damaged by subsequent operations so that the data is not lost if the first copy becomes UECC. At some time after the first copy is written, and the danger of damage to the first copy has passed or dropped significantly, the first copy is checked to determine whether it is acceptable or not. For example, if the first copy is written along a particular word line, it may be checked after neighboring word lines are fully programmed. In an example, the first copy is checked only after the block containing the first copy is fully written. In general, data stored in a block, particularly a 3-D MLC block is subject to disturbance from subsequent write operations directed to other portions of the block. Once such write operations are completed, the risk of disturbance (and the risk of defects that could corrupt the data) drops significantly. Maintaining the second copy after this time may not provide significant additional benefits. Therefore, in some examples, the first copy is checked after the block containing the first copy is fully written. In general, the block is checked as a unit when it is fully written. A backup copy of the data in the block may be contained in blocks that are dedicated to data of the block (e.g. two SLC blocks to backup a two-bit-per-cell MLC block). This arrangement is convenient for subsequent block reclaiming.

Sampling

Various schemes may be used to check that stored data is acceptable. The data may be subject to a conventional read operation, or a read operation using read parameters that are specific for such a checking operation. Data may be subject to ECC or other checking. In one example, stored data is compared with a backup copy to determine how many bits are different. This provides a relatively quick and simple check that may be performed on-chip (i.e. on the memory chip, without sending the data to a memory controller or other external circuit). For example, it may be assumed that the second copy of FIG. 10 contains a much lower number of errors than the first copy so that any differences between these two copies may be assumed to be from the first copy. The two copies may be compared and the total number of bits that are different may be determined. This number may then be compared with a threshold number to determine whether the first copy meets a certain standard or not. In general, an acceptable number of errors is lower than the limit of ECC correction, and may be significantly lower than the limit of ECC correction so that the first copy is not close to becoming UECC.

In general, it is desirable to check data rapidly because the memory may be unavailable for other operations while checking is performed. However, checking the data in a 3-D memory block, and particularly an MLC block, may require significant time and resources. Data in a block may be sampled and the sample data may be used to indicate whether the data stored in the block is acceptable or not. In particular, by using an appropriate sampling pattern, most likely failure modes would be represented in the sample data if they occur. Examples of sampling patterns that may detect many failure modes with a relatively small sample (and therefore relatively short read and compare times) are provided in U.S. patent application Ser. No. 13/929,368, entitled "Efficient post write read in three dimensional nonvolatile memory," filed on Jun. 27, 2013.

In some cases, two or more blocks may share block select circuits. Examples of such shared block select circuits are shown in U.S. Patent Publication No. 2011/0267885. Such paired, or grouped (may more than two) blocks may have particular failure modes that affect a pair or group of blocks as a unit. Pairs of blocks may be operated together so that backup data is maintained until it is confirmed that a pair of blocks contains acceptable data as described in U.S. patent application Ser. No. 13/929,368.

On-Chip Write

Figure 11:
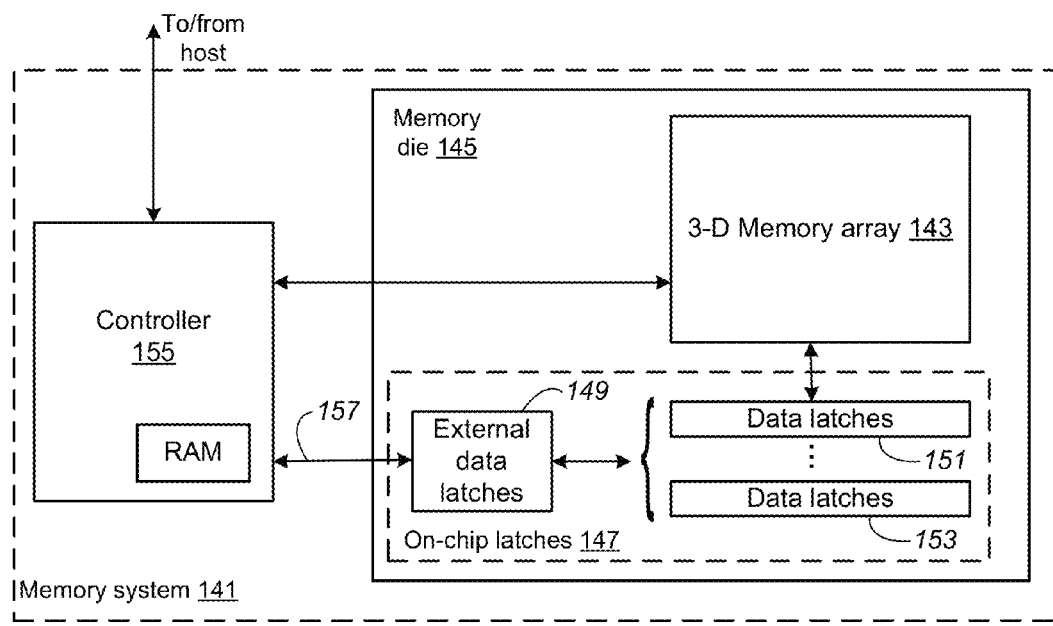
FIG. 11 shows an example of on-chip data latches including multiple rows.

FIG. 11 shows an example of a memory system 141 that includes a three dimensional nonvolatile memory array 143 that is formed on a memory die 145 that also includes on-chip latches 147. In this example, on-chip latches 147 include external data latch "XDL" 149 and data latches 151 and 153 which can hold data to be written to the three dimensional nonvolatile, or data read from the three dimensional memory array. Other examples include more on-chip data latches so that more data can be buffered (e.g. additional rows for middle page data where more than two bits are stored per cell). Examples of data latches and using data latches are described in U.S. Pat. Nos. 8,144,512; 8,307,241; and U.S. Published Application No. 2011/0072332.

In one example, data to be stored in the memory array is sent by the memory controller 155 and is then sent over a memory bus 157 to memory die 145. (There may be multiple memory dies on a given bus and multiple such busses connected to a memory controller.) In the memory die the data is initially received in external data latches 149. The data may then be moved to data latches 151, 153 from which it is written (or programmed) into cells along a word line (row) of the three dimensional memory array. It has been found that on-chip latches can be used to allow a post write read scheme to be efficiently applied.

FIG. 12 shows a timing diagram for an example of a post write read scheme that uses on-chip data latches. The timing diagram shows three forms of activity, in a controller such as controller 155, in a bus between a controller and a memory die such as bus 157, and in a memory die such as memory die 145. In FIG. 12, the controller performs operations in preparation for storing data (e.g. performing address translation for data received from a host). Such operations take some processing time, or "PT" 161 and then data is transferred "Write xfer" 163 over the bus to the memory where it may be buffered into on-chip latches and then programmed into a block of a first format (in this example SLC blocks) "SLC prgm" 165, Programming (also referred to as "writing") may be performed in any suitable manner, for example as a series of programming pulses applied to memory cells to raise their threshold voltages with verify steps in between to determine which cells have reached their target levels so that they can be inhibited from further programming. When SLC programming is complete, the data that is in on-chip data latches may be used to write another copy of the same data into a block of the second format (in this case an MLC block) "MLC prgm" 167. Thus, instead of resending the data from the controller with a new write command, the same data is sent once and is written twice, once in SLC and once in MLC, from the on-chip data latches. The controller may perform some processing 169 to select the appropriate physical location for MLC programming 167 but does not need to resend the data. It will be understood that data latches in this example are connected to a plane that includes both SLC and MLC blocks so that data may be programmed in either format from the on-chip data latches.

In order to maintain the data in on-chip data latches it may be necessary to indicate to the controller that no more data is to be sent to the memory die during SLC programming. While on-chip data latches may allow buffering of data for a subsequent write, in parallel with an ongoing write, such buffering could displace previously buffered data (depending on the configuration of latches). For example, data in external data latches could be displaced by receipt of new data from the controller. A busy indicator such as a flag or signal may be asserted throughout SLC prgm 165 in order to prevent any such displacement of data being programmed in SLC.

In this example, the MLC portion of the memory stores two bits per cell so that upper and lower page data are stored together along a word line of an MLC block. A row of on-chip latches in this example holds a logical page which is stored as either a lower page or upper page in MLC. Subsequently, another page of data is transferred from the controller. This subsequent page may be transferred 171 and buffered in on-chip data latches in parallel with MLC programming 167 because the data being programmed is already backed-up in SLC at this point. Therefore, SLC programming of the subsequent page 173 from the on-chip data latches may begin immediately after MLC programming 167 ends. A busy indicator may be asserted during the SLC programming as before. Data in on-chip data latches is programmed to SLC 173 and then immediately to MLC 175 without being resent from the controller. By maintaining the data in on-chip data latches throughout the time from transfer of the data 171 through MLC programming 175 the data is available for both programming operations 173, 175 without being resent.

Alternating programming to SLC and MLC may proceed as shown in FIG. 12 so that each logical page is stored both as a page in SLC and as either an upper page or lower page in MLC. MLC programming may alternate between lower page and upper page or may follow some other pattern (e.g. a series of lower pages followed by a series of upper pages).

Post write reading of the stored data may be performed at any suitable time. In general, post write reading is performed after a block is full so that the risk of further disturbance is reduced. In some cases it may be desirable to interleave post write reading and programming of new data. Thus, while programming a particular MLC block (and two or more SLC blocks) a previously programmed MLC block (and corresponding SLC block) may be subject to a post write read to determine if data stored in the previously programmed block meets a standard.

FIG. 13 shows an example in which instead of completing MLC programming as in FIG. 12 (MLC program 167), MLC programming is suspended so that a post write read "PW read" may be performed on a previously programmed block in the same plane. MLC programming may be suspended at a suitable point during programming as indicated by the memory die asserting a ready signal. Thus, "MLC cache" 167a represents a first part of an MLC program during which a busy signal is asserted and the target data is maintained in on-chip latches. While the MLC programming is suspended, a post write read occurs 177 so that data is read from memory cells of a full block into on-chip data latches. Then the MLC programming resumes 167b. The data read in the post write read 177 is transferred 179 from the on-chip latches to the memory controller in parallel with resumed MLC programming 167b so that there is some time saving. Subsequently, another logical page of data is transferred 181 from the memory controller in parallel with the resumed MLC programming 167b and is programmed 183.

Post write read data that is transferred in this manner may include data from MLC blocks and/or SLC blocks that is then compared in order to determine whether an MLC block meets a standard. The memory controller may perform such comparison in parallel with further programming in the memory array. Post write read 177 may include one or more MLC pages and/or one or more SLC pages.

The above example refers to a situation where both the MLC block and SLC blocks being programmed are in the same plane of the same die so that they can efficiently use the same on-chip data latches. This may not always be the case. In some cases, SLC data may be written in one plane and MLC data may be written in a different plane. Where such planes are located on the same die it may be necessary to send and program data sequentially. Where such planes are located on different dies it may be possible to perform some steps in parallel to achieve a time saving.

FIG. 14 shows an example of writing data in two different formats (SLC and MLC) in two different dies, die 0 and die 1, with some parallel steps to save time. After a controller performs processing 185, data to be written to memory die 0 is transferred "Write xfer D0" 187 and begins to be programmed in die 0 as SLC data "SLC prgm" 189. In parallel with programming this data in SLC, data is transferred to die 1 191 and begins to be programmed in MLC "MLC prgm" 193. On-chip data latches allow additional data to be sent to die 0 195 while previous data is being programmed in die 0 189. This additional data is then written in die 0 in SLC format 197. In parallel with writing this data, additional data is transferred to die 1 199 where it is programmed in MLC format 201. While a portion of data to be stored in the memory array is transferred twice (once to each die) to be stored in MLC and SLC format, parallel operation allows these operations to be performed efficiently.

Full Sequence Programming

It is common to program MLC memories so that interactions between cells are reduced. The order in which upper and lower pages are programmed may be chosen so that an upper page of a particular word line is only programmed after neighbors on either side have been programmed with at least lower page data. Another scheme for programming data programs both lower and upper page data together along a word line. Such a scheme may be referred to as "full sequence programming." Examples of full sequence programming are described in U.S. patent application Ser. No. 13/788,415, filed on Mar. 7, 3013. Aspects of the present invention relate to using such full sequence programming with a post write read in three dimensional nonvolatile memory systems.

Figure 15:
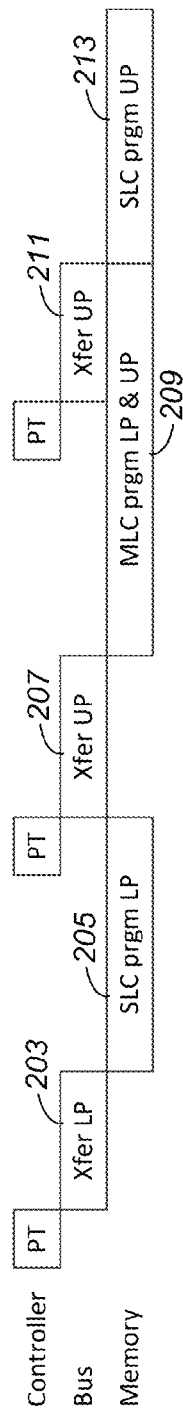
FIG. 15 is a timing diagram illustrating full sequence programming where lower page data is maintained in on-chip data latches.

FIG. 15 is a timing diagram showing an example of data that is programmed in both SLC and MLC as part of a scheme that uses a post write read. A first logical page of data that is assigned to a lower page in MLC is sent from the controller 203, buffered in on-chip latches, and written in an SLC block 205. A busy signal may be maintained throughout this program operation so that additional data is not sent. When SLC programming 205 is complete, upper page data is transferred from the controller 207 and is buffered in the on-chip data latches. On-chip data latches may be configured so that the lower page data remains in the data latches while the upper page data is transferred to the on-chip data latches. This puts lower page and upper page data in different rows of the on-chip data latches. With lower and upper pages both in appropriate rows of the on-chip data latches, MLC programming of both lower and upper pages 209 may be performed together. A busy indicator may be maintained until this programming has progressed to a point where new data can be buffered (e.g. when lower page data is written and the corresponding row in the on-chip data latches is available). Upper page data may be transferred 211 in parallel with programming 209 once the ready indicator is asserted and this data is buffered and then written in SLC format 213. Thus, in this scheme upper page data is transferred twice while lower page data is transferred only once.

Figure 16:
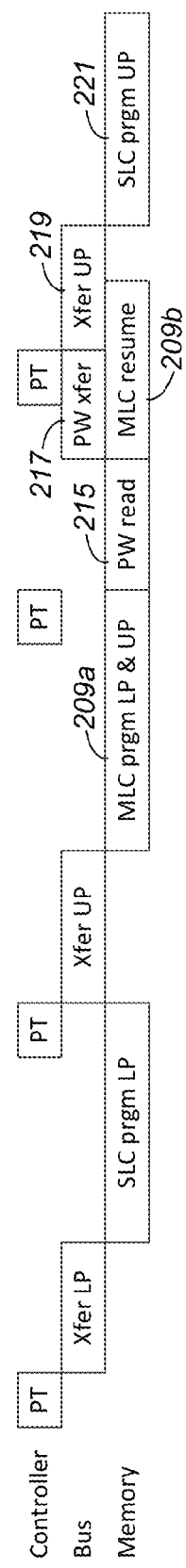
FIG. 16 is a timing diagram illustrating full sequence programming where lower page data is maintained in on-chip data latches and MLC programming is interleaved with post write reads.

The scheme of FIG. 15 may be suspended so that a post write read may be performed in a similar manner to that described above. FIG. 16 shows how MLC programming of lower page and upper page data together is suspended after a first programming time 209a and a post write read 215 of a previously programmed block is performed while it is suspended. The MLC programming is resumed 209b and the data obtained by the post write read is transferred 217 in parallel with the resumed programming. After the post write read data is transferred 217 from the on-chip data latches, upper page data may be transferred 219 from the controller to the on-chip data latches to be programmed in SLC format 221.

Figure 17:
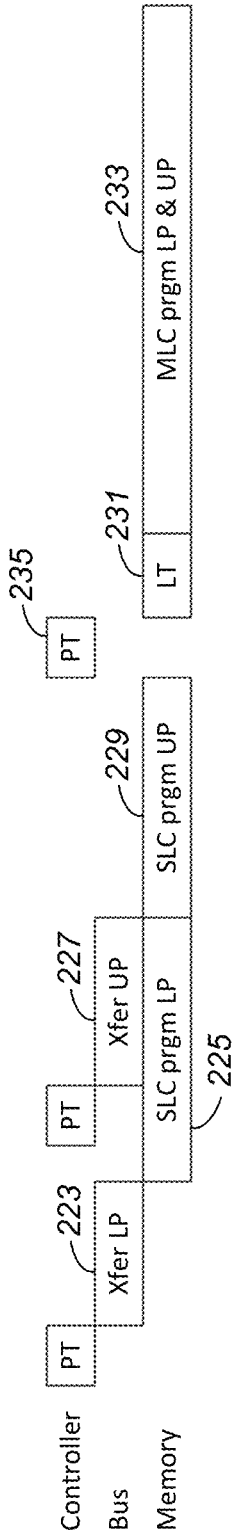
FIG. 17 is a timing diagram illustrating full sequence programming where both lower and upper page data is maintained in on-chip data latches.

Another scheme for performing full sequence programming is shown in FIG. 17. In this example, a lower page of data is transferred 223, buffered in on-chip data latches, and stored in SLC format 225. An upper page is transferred 227 in parallel with programming of the lower page in SLC 225, and is buffered and programmed in SLC 229. Thus, both lower and upper pages are buffered and programmed in SLC format. Subsequently, in response to a command from the controller, the copies of the lower and upper pages in on-chip data latches are used to program the lower and upper page data together in MLC format 233. A latch transfer operation 231 may be necessary to place the lower and upper page data in appropriate rows of data latches so that they may be programmed together. This may require some action by the controller 235 (e.g. a determination of which data needs to be moved and generation of an appropriate command to the memory die). In some examples, the order of sending the lower page and upper page data may be selected so that latch transfer is reduced or eliminated. Thus, in this example, each logical page of data (LP and UP) is transferred only once and buffered so that it can be written twice from the on-chip data latches, once in SLC format and once in MLC format. This may be considered an automated operation in which data is rearranged within on-chip latches so that the appropriate data for the next write operation is simply moved internally in on-chip latches. This is in contrast to what may be considered a "manual" operation. The operation shown in FIG. 15 may be considered a manual operation because the controller has to "manually" place the data in the appropriate data latch by resending it which generally takes more time and resources than simply performing an internal transfer (transfer time from the controller to the memory die through a bus takes much longer than an internal transfer from one row of data latches to another).

Figure 18:
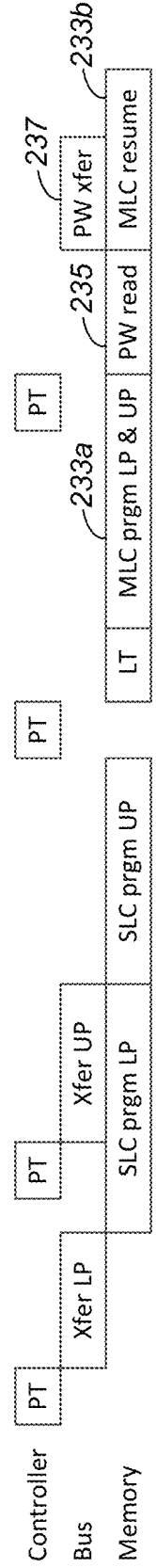
FIG. 18 is a timing diagram illustrating full sequence programming where both lower and upper page data is maintained in on-chip data latches and MLC programming is interleaved with post write reads.

The scheme of FIG. 17 may be modified to allow suspension of the MLC programming so that post write reading may be interleaved with writing of new data. FIG. 18 shows an example where lower page and upper page data are transferred and programmed in SLC as before. Then full sequence programming of both lower and upper page data together begins and continues 233a up to a point where it is suspended and a post write read of a previously written block is performed 235. The MLC programming then resumes 233b and in parallel the post write data is transferred 237 to the controller to check the data.

Hardware

Figure 19:
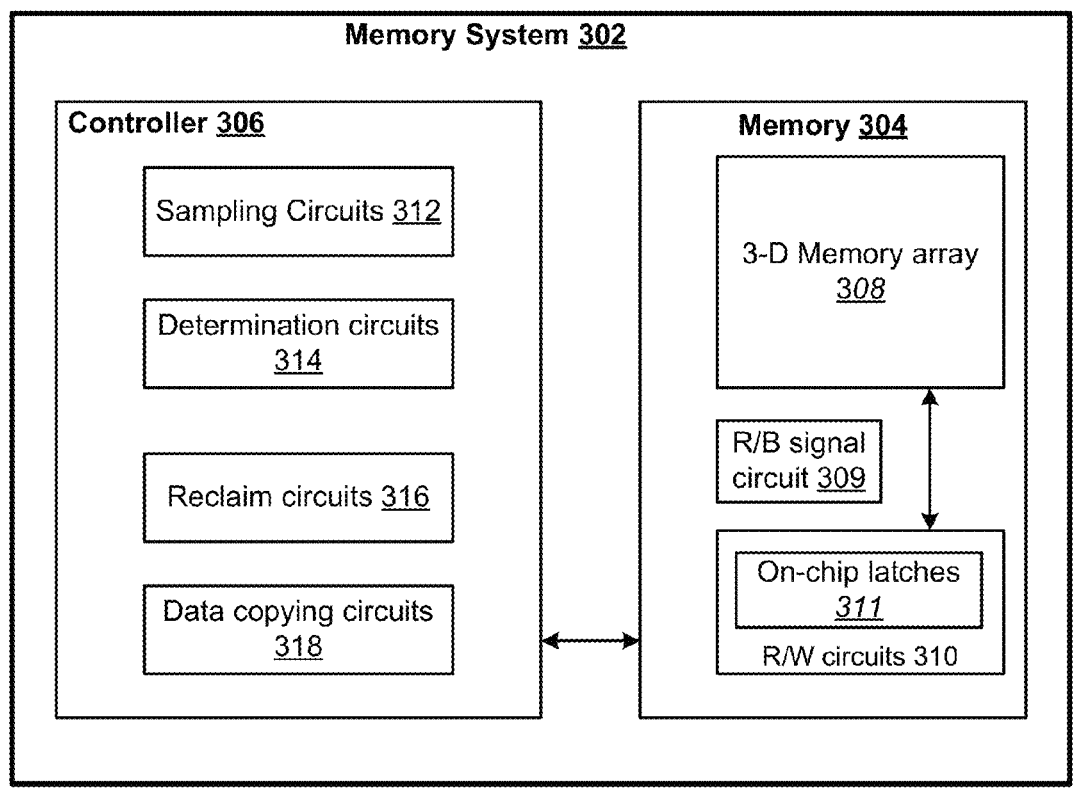
FIG. 19 shows an example of hardware that may be used.

Various hardware may be used to implement aspects of the present invention. FIG. 19 shows an example of hardware that may be used. A memory system 302 includes a memory die 304 and a memory controller die 306. Memory die 304 includes a 3-D memory array 308 that includes individually erasable blocks, which may be paired so that paired blocks share block select circuits. The memory has two portions, a higher density higher error rate portion (e.g. MLC portion), and a lower density lower error rate portion (e.g. SLC portion). Memory die 304 also includes read/write circuits 310 which access the memory array to read and write data. On-chip data latches 311 may be considered part of read/write circuits 310. On chip data latches may include an appropriate number of rows of data latches for the operations to be performed. Ready/Busy signal circuit 309 is provided to assert either a ready signal or busy signal as appropriate so that the controller can determine when the memory is ready to receive more data. Memory controller 306 includes sampling circuits 312 that are responsible for sampling word lines of blocks according to a sampling pattern. Determination circuits 314 may determine whether sampled data meets a standard. For example determination circuits 314 may compare the sampled data from a block in the high error rate portion with corresponding data in the low error rate portion to determine how many errors are in the sampled data. Determination circuits 314 may then compare this number of errors with a threshold value to see if the sampled data meets a standard. Reclaim circuits 316 are responsible for identifying blocks that can be reclaimed. For example, when a high error rate block is found to meet the standard then corresponding data in low error rate blocks is no longer needed for backup which may make one or more low error rate blocks available for reclaim. Where a high error rate block does not meet the standard then the high error rate block may be made available for reclaim. In this case, data copying circuits 318 are provided to read backup data from the low error rate portion and copy it into a new block in the high error rate portion. It will be understood that various additional circuits, including those shown in FIG. 1 and others, may also be provided. The hardware is provided as an example and other hardware may be used (for example providing some of the circuits on the memory die, or on a separate die, instead of on a controller die).

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a nonvolatile memory array comprising:

receiving a first portion of data to be stored in the nonvolatile memory array;

buffering the first portion of data in on-chip data latches;

writing the first portion of data from the on-chip data latches to the nonvolatile memory array in Single Level Cell (SLC) format;

subsequently receiving a second portion of data to be stored in the nonvolatile memory array;

buffering the second portion of data in the on-chip data latches with the first portion of data;

subsequently, writing the first and second portions of data together in Multi Level Cell (MLC) format in a word line of an MLC block as lower page and upper page data respectively;

subsequently, receiving the second portion of data at least partially in parallel with the storing the first and second portions together in MLC format;

subsequently storing the second portion of data in SLC format;

subsequently comparing the second portion in MLC format with the second portion in SLC format to determine if the second portion in MLC format meets a standard; and discarding the first and second portions in SLC format only if the second portion in MLC format meets the standard.

2. The method of claim 1 further comprising:

suspending the storing of the first and second portions of data together in MLC format in the word line of the MLC block;

subsequently, performing a post write read of a third portion of data from another MLC block that was previously filled;

subsequently, resuming the storing of the first and second portions together in MLC format in the word line of the MLC block; and in parallel with the resumed storing of the first and second portions together in MLC format in the word line of the MLC block, transferring the third portion of data from the post write read.

3. The method of claim 1 further comprising:

comparing the first portion in MLC format with the first portion in SLC format to determine if the first portion in MLC format meets a standard; and discarding the first and second portions in SLC format only if the first portion in MLC format meets the standard.

4. The method of claim 1 wherein the comparing occurs only after the MLC block is full.

5. The method of claim 1 wherein the comparing includes determining a number of bits that are different between the second portion of data in MLC format and the second portion of data in SLC format.

6. The method of claim 5 wherein the standard is a limit for the number of bits that are different.

7. The method of claim 1 further comprising, if the second portion in MLC format does not meet the standard, then discarding the first and second portions in MLC format and using the first and second portions in SLC format.

8. A method of operating a three dimensional nonvolatile memory array comprising:
receiving first and second portions of data to be stored in the three dimensional nonvolatile memory array;
buffering the first and second portions of data in on-chip data latches;
writing the first and second portions of data in a Single Level Cell (SLC) portion of the three dimensional nonvolatile memory array;
subsequently writing the first portion of data as lower page data and writing the second portion of data as upper page data together in a row of a Multi Level Cell (MLC) portion of the memory array;
maintaining the first portion of data in on-chip data latches throughout a time that extends from the buffering of the first portion of data to the writing the first portion of data as lower page data in the MLC portion of the memory array; and
subsequently erasing the first and second portions of data in the SLC portion only after a post write read confirms that the MLC portion of the memory array contains an accurate copy of the first and second portions of data.

9. The method of claim 8 further comprising maintaining the second portion of data in on-chip data latches throughout a time that extends from the buffering of the second portion of data to the writing of the second portion of data as upper page data in the MLC portion of the memory array.

10. The method of claim 8 wherein a die busy signal is maintained until the first portion of data is written as lower page data in the row of the MLC portion of the memory array.

11. The method of claim 10 wherein a die ready signal is initiated when the first portion of data is written as lower page data in the row of the MLC portion of the memory array prior to writing the second portion of data as upper page data in the row of the MLC portion.

12. The method of claim 8 further comprising:
suspending the storing of the first and second portions together in the row of the MLC portion;
subsequently, performing a post write read of a third portion of data from another MLC block that was previously filled;
subsequently, resuming the storing of the first and second portions together in MLC format in the row of the MLC portion; and
in parallel with the resumed storing of the first and second portions together in MLC format in the row of the MLC portion, transferring the third portion of data from the post write read.

13. The method of claim 8 wherein the post write read comprises:
comparing at least the second portion in MLC format with the second portion in SLC format to determine if the second portion in MLC format meets a standard; and
discarding the first and second portions in SLC format only if the second portion in MLC format meets the standard.

14. The method of claim 8 further wherein the post write read samples a block of the MLC portion by reading at least one word line from each group of connected word lines and reading at least one word line from each set of strings of the block.

15. The method of claim 8 further comprising performing a latch transfer operation to move the first portion of data and/or the second portion of data between rows of the on-chip data latches.

16. A three dimensional nonvolatile memory system comprising:
a Single Level Cell (SLC) portion of the three dimensional nonvolatile memory array;
a Multi Level Cell (MLC) portion of the three dimensional nonvolatile memory array;
on-chip data latches that are configured to hold data to be stored in the SLC and MLC portions throughout a time from receiving the data until the data is stored in both SLC and MLC portions;
a write circuit that is configured to write lower page data and upper page data from the on-chip data latches to the SLC portion, and then write the lower page data and the upper page data together from the on-chip data latches to the MLC portion;
a determination circuit configured to determine whether programmed data in a fully programmed block of the MLC portion meets a standard; and
a reclaim circuit that is configured to erase blocks of the SLC portion in response to the determination circuit determining that a corresponding fully programmed block of the MLC portion meets the standard.

17. The three dimensional nonvolatile memory system of claim 16 wherein the write circuit is configured to write the lower page data and the upper page data together along a word line of the MLC portion.

18. The three dimensional nonvolatile memory system of claim 16 further comprising sampling circuits that are configured to sample data of a fully written block of the MLC portion and provide sampled data to the determination circuit for comparison with corresponding data from the SLC portion.

* * * * *